United States Patent
Pfeifle et al.

(10) Patent No.: US 11,334,605 B2
(45) Date of Patent: May 17, 2022

(54) INCREMENTAL UPDATE OF COMPRESSED NAVIGATIONAL DATABASES

(71) Applicant: HERE GLOBAL B.V., Eindhoven (NL)

(72) Inventors: Martin Pfeifle, Seewald (DE); Shripad Kulkarni, Maharashtra (IN); Abhinav Kumar, Bihar (IN)

(73) Assignee: HERE GLOBAL B.V., Eindhoven (NL)

(*) Notice: Subject to any disclaimer, the term of this patent is extended or adjusted under 35 U.S.C. 154(b) by 589 days.

(21) Appl. No.: 15/579,073

(22) PCT Filed: Jun. 3, 2016

(86) PCT No.: PCT/EP2016/062599
§ 371 (c)(1),
(2) Date: Dec. 1, 2017

(87) PCT Pub. No.: WO2016/193408
PCT Pub. Date: Dec. 8, 2016

(65) Prior Publication Data
US 2018/0173723 A1    Jun. 21, 2018

(30) Foreign Application Priority Data

Sep. 23, 2015 (IN) .......................... 5097/CHE/2015

(51) Int. Cl.
*G06F 16/29* (2019.01)
*G06F 16/23* (2019.01)
(Continued)

(52) U.S. Cl.
CPC ............ *G06F 16/29* (2019.01); *G01C 21/32* (2013.01); *G06F 16/116* (2019.01);
(Continued)

(58) Field of Classification Search
CPC ........ G06F 16/29; G06F 16/23; G06F 16/148; G06F 16/1727; G06F 16/116; G01C 21/32
See application file for complete search history.

(56) References Cited

U.S. PATENT DOCUMENTS

| | | | |
|---|---|---|---|
| 7,349,905 B1 | 3/2008 | Jooste | |
| 7,669,212 B2 | 2/2010 | Alao et al. | |

(Continued)

FOREIGN PATENT DOCUMENTS

| | | |
|---|---|---|
| DE | 10 2005 029744 A1 | 12/2006 |
| EP | 2 709 022 A1 | 3/2014 |

OTHER PUBLICATIONS

International Search Report and Written Opinion for Application No. PCT/EP2016/062599 dated Sep. 1, 2, 2016, 11 pages.

(Continued)

*Primary Examiner* — Vaishali Shah
(74) *Attorney, Agent, or Firm* — Alston & Bird LLP

(57) ABSTRACT

A computing device may identify a plurality of equally sized data blocks of a first navigation file and may identify a plurality of equally sized data blocks of a second navigation file. The computing device may perform binary difference operations between the data blocks of the first navigation file to corresponding data blocks of the second navigation file The result of the binary difference operations is stored in a plurality of navigation patch files. At least two of the plurality of navigation patch files are merged into a merged navigation patch file.

22 Claims, 15 Drawing Sheets

(51) Int. Cl.
  *G06F 16/11* (2019.01)
  *G06F 16/14* (2019.01)
  *G06F 16/17* (2019.01)
  *G01C 21/32* (2006.01)

(52) U.S. Cl.
  CPC ........ *G06F 16/148* (2019.01); *G06F 16/1727* (2019.01); *G06F 16/23* (2019.01)

(56) References Cited

U.S. PATENT DOCUMENTS

| | | |
|---|---|---|
| 8,068,715 B2 | 11/2011 | Kewitsch |
| 8,275,782 B2 | 9/2012 | Hirsch et al. |
| 8,280,850 B2 | 10/2012 | Lauther |
| 8,566,346 B2 | 10/2013 | Richter et al. |
| 8,827,710 B2 | 9/2014 | Zitnick, III et al. |
| 9,057,622 B2 | 6/2015 | Pfeifle |
| 9,075,822 B2 | 7/2015 | Richter et al. |
| 9,160,817 B2 | 10/2015 | Richter et al. |
| 9,235,598 B2 | 1/2016 | Pfeifle |
| 9,581,452 B2 | 2/2017 | Pfeifle |
| 9,626,599 B2 | 4/2017 | Zhang et al. |
| 9,934,289 B2 | 4/2018 | Pfeifle |
| 9,976,859 B2 | 5/2018 | Pfeifle |
| 10,030,985 B2 | 7/2018 | Pfeifle |
| 10,289,636 B2 | 5/2019 | Pfeifle et al. |
| 10,444,025 B2 | 10/2019 | Pfeifle |
| 10,642,824 B2 | 5/2020 | Pfeifle |
| 10,698,929 B2 | 6/2020 | Pfeifle |
| 2005/0063242 A1 | 3/2005 | Ren |
| 2007/0038681 A1 | 2/2007 | Pierce et al. |
| 2007/0294684 A1* | 12/2007 | Kumashiro ............... G06F 8/65 717/168 |
| 2010/0191752 A1* | 7/2010 | Lauther ................... G06F 8/71 707/758 |
| 2010/0312757 A1 | 12/2010 | Meschenmoser et al. |
| 2011/0029749 A1* | 2/2011 | Yang ................... G06F 12/0246 711/162 |
| 2011/0137546 A1 | 6/2011 | Roesser et al. |
| 2011/0173601 A1 | 7/2011 | de los Reyes |
| 2012/0036150 A1 | 2/2012 | Richter et al. |
| 2012/0323923 A1* | 12/2012 | Duan ................ G06F 16/24554 707/741 |
| 2014/0019822 A1* | 1/2014 | Esumi ............... H03M 13/2906 714/755 |
| 2014/0081922 A1* | 3/2014 | Kunath ................... G01C 21/32 707/679 |
| 2014/0101096 A1* | 4/2014 | Pfeifle ..................... G06F 16/23 707/609 |
| 2014/0108462 A1 | 4/2014 | Pfeifle et al. |
| 2015/0351663 A1* | 12/2015 | Zigel .................... A61B 5/4803 600/586 |
| 2016/0047670 A1 | 2/2016 | Grun et al. |
| 2016/0350010 A1* | 12/2016 | Ryan ..................... G06F 3/0661 |

OTHER PUBLICATIONS

Office Action for India Application No. 2800/CHE/2015 dated Jul. 30, 2019, 5 pages.
Ludtke, D. et al., *Update of File-System-Based Navigation Databases*, Vehicular Technology Conference (2008) 3006-3010.
Binary diff/patch utility, available at http://www.daemonology.net/bsdiff/ (undated) 1 page.
About SQLite [online] [retrieved Nov. 13, 2019]. Retrieved from the Internet: https://web.archive.org/web/20171126161217/http://www.sqlite.org/about.html (dated Nov. 26, 2017) 2 pages.
NDS Association [online] [retieved Nov. 13, 2019]. Retrieved from the Internet: https://web.archive.org/web/20171024160647/https://www.nds-association.org/ (dated Oct. 24, 2017) 14 pages.
Office Action for India Application No. 5097/CHE/2015 dated Dec. 6, 2018, 6 pages.
Office Action for European Application No. 16727179.0 dated May 27, 2021, 6 pages.

* cited by examiner

| Old Blocks | Size | Start Index |
|---|---|---|
| 01 | 8 MB | 0 |
| 02 | 8 MB | 8 |
| 03 | 3 MB (because of less data) | 16 |
| 04 | 2 MB | 7 |
| 05 | 2 MB | 15 |

FIG. 6

| Index | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| Patch Size for Best Matching | 50 | 46 | 75 | 73 | 99 | 75 | 24 | 65 | 43 | 73 | 83 | 67 | 53 | 22 | 234 | 441 | 245 |
| Best Matching Old Block Number | 1 | 1 | 1 | 1 | 1 | 4 | 2 | 2 | 2 | 2 | 2 | 3 | 3 | 3 | 1 | 5 | 2 |
| Best Matching Old Block Size | 8 | 8 | 8 | 8 | 8 | 2 | 8 | 8 | 8 | 8 | 8 | 3 | 3 | 3 | 8 | 2 | 8 |

FIG. 8

INCREMENTAL UPDATE OF COMPRESSED NAVIGATIONAL DATABASES

FIELD

The following disclosure relates to map updates, and more particularly to map updates of a geographic database based on bytewise difference operations.

BACKGROUND

Map databases are used in computer-based systems that provide useful features to users. For example, the identification of routes to destinations or points of interests. A navigation system determines the optimum route to be taken by the end user to travel from the origin to the destination location from map data stored in a geographic (or map) database. Map databases are also used in advanced driver assistance systems, such as curve warning systems, adaptive cruise control systems and headlight aiming systems. Map databases are also used in systems that improve vehicle fuel economy, such as systems that optimize transmission gear selection taking into account upcoming slope and speed changes.

As new roads are built, roads are closed, or locations of business are changed, the geographic database is updated. One way to update map data is to replace the entire existing map database with a new version of the geographic database containing new, updated map data. However, a replacement of the entire map database is a relatively expensive and time consuming process and may be unnecessary considering that much of the map data may not be changed from the old version to the new version. Further, wholesale map updates in mobile devices introduce challenges because bandwidth is often limited and map updates are often bulky and require high bandwidth.

SUMMARY

In one embodiment, a method includes identifying, using a processor, a plurality of equally sized data blocks of a first navigation file, identifying, using the processor, a plurality of equally sized data blocks of a second navigation file, performing binary difference operations between the data blocks of the first navigation file to corresponding data blocks of the second navigation file, storing the result of the binary difference operations in a plurality of navigation patch files and merging at least two of the plurality of navigation patch files into a merged navigation patch file.

In one embodiment, a computing device is configured to divide a first navigation file into a first plurality of data elements having a first predetermined size, define a second plurality of data elements of the first navigation file having a second predetermined size, wherein a midpoint of each of the second plurality of data elements of the first navigation file intersects a border between two of the first plurality of data elements of the first navigation file, divide a second navigation file into a plurality of data elements having a third predetermined size, calculate a plurality of binary differences between each of the first plurality of data elements of the first navigation file to corresponding data elements of the plurality of data elements of the second navigation file and between each of the second plurality of data elements of the first navigation file to corresponding data elements of the plurality of data elements of the second navigation file and store the binary differences as a plurality of navigation patch files.

In one embodiment, a computing device is configured to receive a first navigation file and a second navigation file, wherein the navigation files include road segment attributes, divide the first navigation file into equally sized data blocks, a remainder data block and overlapping data blocks, divide the second navigation file into equally sized data blocks and a remainder data block, perform binary difference operations between the between each data block of the first navigation file to related data blocks of the second navigation file and to data blocks of the second navigation file corresponding to a left focus and a right focus and store the result of the binary difference operations in a plurality of navigation patch files.

BRIEF DESCRIPTION OF THE DRAWINGS

Exemplary embodiments of the present invention are described herein with reference to the following drawings.

FIG. 6 illustrates an example data block sizes and data block starting indexes according to an embodiment of the disclosed invention.

FIG. 8 illustrates an example data block array for patch files according to an embodiment of the disclosed invention.

DETAILED DESCRIPTION

Significant efforts have been directed toward update techniques for navigation databases on embedded devices, including mobile phones or head units in vehicles. Navigation databases may need to be updated frequently, such as monthly, weekly or daily. As the amount of navigation related content and features on these devices increases, so does the size of the database. As a consequence, keeping the databases up to date with changes in locations, points of interests, and road network require large file sizes and updates have been taking longer to execute.

Figure 1:
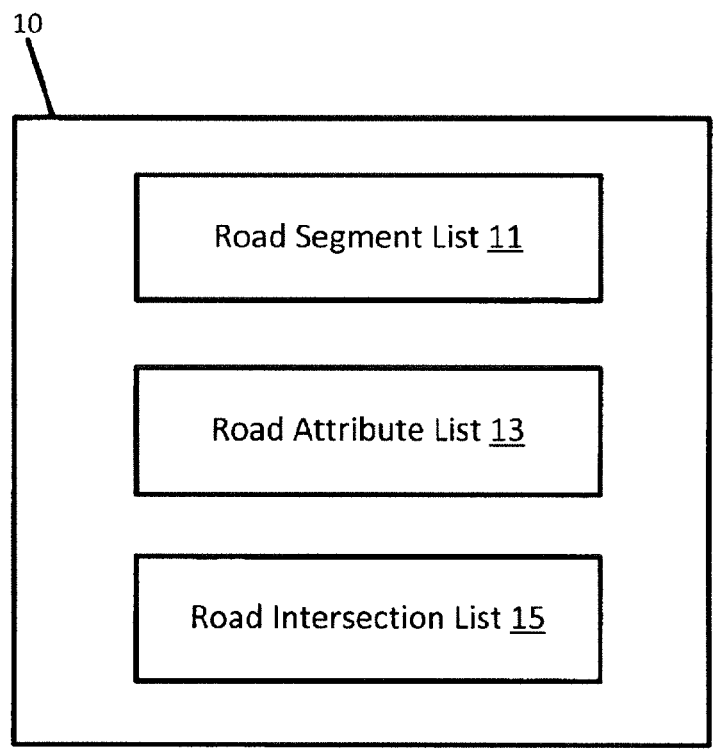
FIG. 1 illustrates an example routing tile.

Routing or basic map display data may be organized in BLOBs (binary large objects). The content of these BLOBs may include "metadata" and "payload" data which is often organized in lists. FIG. 1 illustrates a BLOB structure 10 for the main routing function of a navigation database, which may be referred to as the routing tile. The routing tile includes metadata and payload. As illustrated, the metadata includes the routing tile header and the payload includes various list structures such as road segment list 11, road attribute list 13, and road intersection list 15. A navigation file (e.g., SQLite file) may include dozens to thousands of BLOBs in tables. In the navigational database standard (NDS), for example, an NDS database may consist of one or more SQLite files containing the navigational content and one or more speech recognition files (e.g., from Nuance). Speech recognition files may be encoded in an unknown proprietary format.

Replacing the entire navigation database during an update requires significant bandwidth and time. This may be especially problematic when updates are delivered over air via wireless networks. An update script and patch files may be used so that only changes are sent from the map developer to the navigation device. Utilizing update scripts and patch files can reduce the required bandwidth and time by delivering a patch file that is approximately 10-20% of the size of the new navigation database file.

One technique for identifying the changes in a new navigation database file is a binary difference operation. A binary difference operation compares data on the byte level. A binary difference calculates the difference between two bit strings by comparing the first bit in one string to the first bit of the other string, and so forth. For example, when current navigation data is compared to new navigation data, the first byte of the current navigation data is compared to the first byte of the new navigation data, the second byte of the current navigation data is compared to the second byte of the new navigation data, and so on. The result of the binary difference operation may include the byte locations of the differences in the data and the edit operation for that location. Example edit operations include add data, delete data, or modify data.

Figure 2:
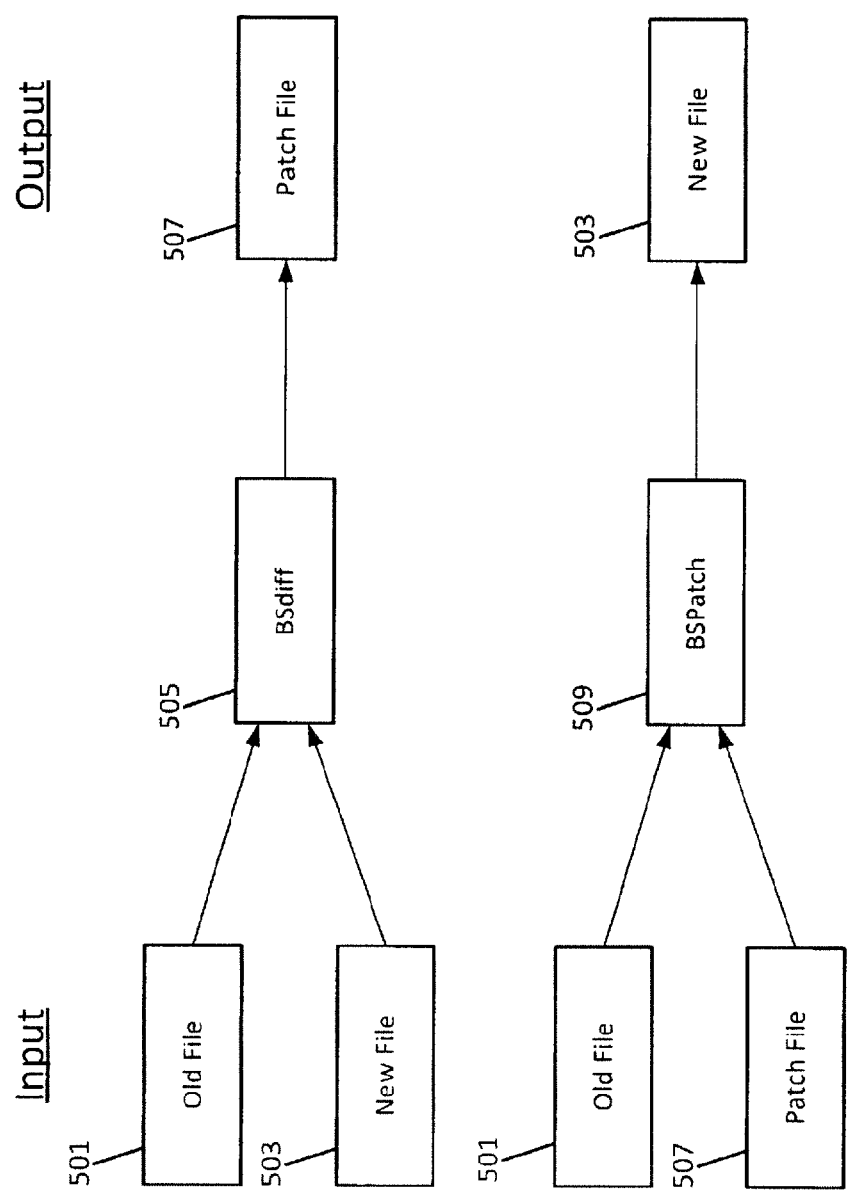
FIG. 2 illustrates example inputs and outputs to bytewise subtraction difference (BSdiff) and BSdiff patch (BSPatch) algorithms.

Another technique for identifying the changes in a new navigation database file is bytewise difference operations, for example a bytewise subtraction difference (BSdiff) operation. FIG. 2 illustrates example inputs and output of to a BSdiff algorithm. For example, BSdiff 505 may accept any two versions of a file (e.g., old file 501 and new file 503) and outputs a patch file (e.g., patch file 507). BSdiff can be applied to any type of file, and is not restricted to navigation files, NDS files or BLOBs. When updating an NDS database, the SQLite files and the speech recognition files must be updated concurrently. As the structure of the speech recognition files may be unknown, a standard BSdiff approach may be utilized to compute the update patch files for the speech recognition files. BSdiff operations may also be applied to the SQLite file concurrently. One or more patch files are typically created by a server performing the BSdiff operation, and the one or more patch file may be transmitted to navigation devices to run an update script (e.g., BSPatch).

A BSdiff patch file may be generated according to the following format. The first 32 bytes makeup the Header block. The first 8 bytes of the Header contain the text "BSDIFF40," followed by 8 bytes containing the Control block length. The next 8 bytes contain the Diff block length. Finally, the last 8 bytes of the Header contain the new file size. Next, the Control block contains one or more 24 byte rows, with each row representing a "ctrl0," "ctrl1" and "ctrl2," each 8 bytes long. Ctrl0 represents length of Diff block, indicating how many bytes will be read from Diff block. Ctrl1 represents length of Extra block, indicating how many bytes will be read from Extra block. Ctrl2 represents the seek offset for next row in the Control block. The total length of the Control block is contained in the Header. The control block is compressed by using bzip2. Next, the Diff block represents approximately matching bytes from the old and new files that were subtracted and concatenated. The total length of the Diff block is contained in the Header. This Diff block is also compressed by bzip2. Finally, the Extra block represents non-matching contents from the new file. The total length of the Extra block is not contained in the patch file, as the Extra block spans the remainder of the patch file. Bzip2 is also used to compress the Extra block, but the compression may not succeed to reduce overall size as it succeeds for the Control block and the Diff block.

By way of example, a patch file may be generated according to the following BSdiff algorithm. First, the location of the old file and the new file, as well as the target location of the patch file received as inputs. Second, the entire old file is read into memory buffer. Third, a suffix tree is generated for the entire old file. Fourth, the new file is read byte by byte to identify the best match within the entirety of the old file. Step four takes advantage of the suffix tree created in step three. Fifth, approximately matching byte differences are identified and stored in the Diff block. Newly added bytes are also identified and appended in the Extra block. A Control block row (ctrl0, ctrl1 and ctrl2) may be appended to the Control block such that: ctrl0 will represent the length of uncompressed Diff block with approximately matching bytes; ctrl1 will represent the length of the uncompressed Extra block with newly added bytes from the new file; and ctrl2 will represent the seek offset providing the seek location of the next best matching block from the old file. Sixth, the Control block, Diff block and Extra block are compressed using bzip2. Seventh, steps four through six are repeated until the new file has been processed completely. Eighth, the Header is updated with the correct values of the Control block size, Diff block size and new file size to complete the patch file.

FIG. 2 further illustrates example inputs and output of a BSPatch algorithm. For example, BSPatch 509 may receive a patch file (e.g., patch file 507) and uses the old file used to generate the patch file (e.g., old file 501) to generate the new file used to generate the patch file (e.g., new file 503). The patch file(s) are typically used by navigation devices performing the BSPatch operation, allowing the navigation device to update its navigation database.

As described above, a standard BSdiff operation attempts to find the best match for sections of the new file within the entirety of the old file. BSdiff algorithms attempt to find patterns in the old file that can be used for generating the new file. Thus, the BSPatch operation refers to positions in the old file where the matching patterns were located by the BSdiff operation. Because the BSdiff algorithm seeks to find the best match within the entire old file, the patch file may contain large seek offset values (i.e., ctrl2) for each row in the Control block.

Figure 3:
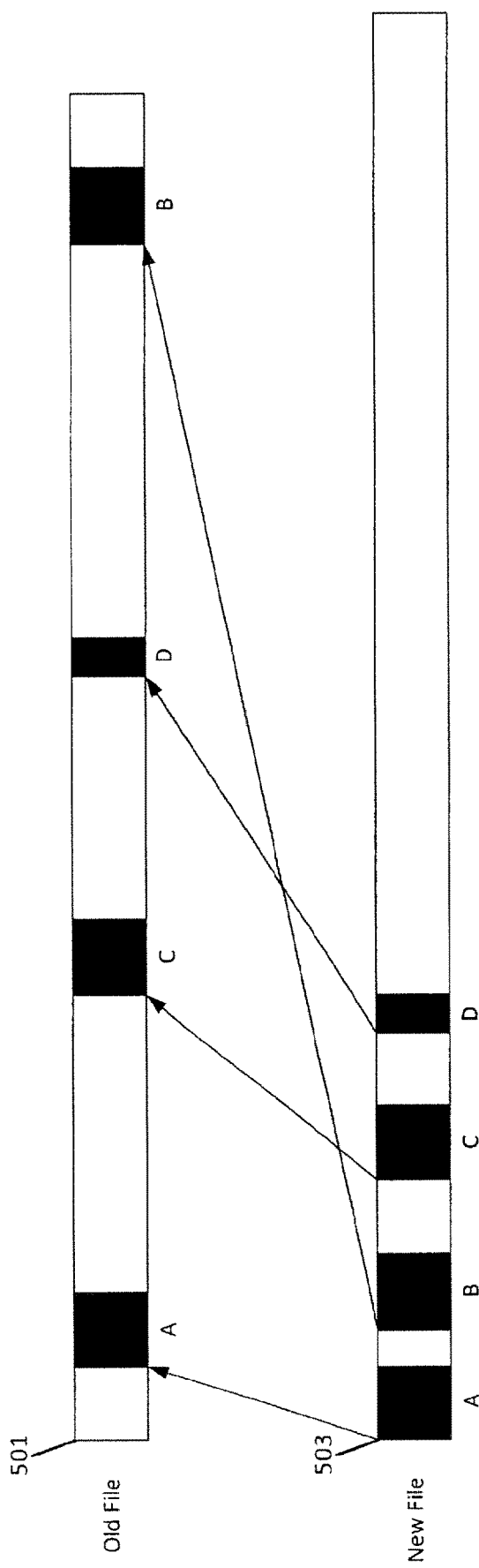
FIG. 3 illustrates an example of how a BSdiff algorithm may identify the matching data patterns.

FIG. 3 illustrates an example of how a BSdiff algorithm may identify the best matching patterns for the new file within the old file. For the purposes of this example, data blocks from the new file 503 are labeled with the same letter corresponding data blocks from the old file 501. When reading data block A from the old file, BSPatch must seek from its current position in the old file (e.g., beginning at index 0) to the start of data block A. In this case, the seek offset will be a positive number and BSPatch will perform a read operation from data block A. Next, BSPatch will read from data block B. The seek offset from the end of data block A (e.g., a numerically low index value) to the beginning of data block B (e.g., a numerically high index value) will require a large seek offset, in the positive direction. BSPatch will continue seek and read operations until each corresponding data block has been read. The seek offset value from the end of data block B to the beginning of data block C is a large, negative value. Finally, the seek offset value from the end of data block C to the beginning of data block D will be a large, positive number, and so on for the remaining data blocks.

Large seek offset values between rows in the Control block result from matching and reading data from the old file in a scattered manner. Therefore, the BSPatch operation must also read data from the old file in the same, scattered manner.

For small file sizes, BSdiff and BSPatch may be an efficient way to provide database updates. For example, when file sizes are small, the entire old file may be loaded into buffer by the target system, and each read and seek operation merely corresponds to an efficient array access. However, as file sizes increase, reading data from the old file in a scattered manner may be inefficient because the target system may not be able to load the entire old file into buffer. For example, some navigation files are very large, up to and exceeding 1 gigabyte in size, and the target systems, such as mobile devices and automotive head units, have a very limited amount of main memory. In this example, the old file cannot be kept in main memory. When the old file cannot be entirely loaded into memory, a physical I/O operation (e.g., fseek/fread) may be required for each Control block entry of the patch file. The physical I/O operations may be time consuming and lead to BSPatch algorithm times of up to and exceeding 50 hours for a navigation database update.

The following embodiments describe examples of a new BSdiff approach which may reduce I/O operations considerably and speed up BSPatch on embedded systems by a factor of up to and exceeding 100. The new BSdiff approach takes advantage of the fact that new navigational databases are typically created in the same sequential order, resulting in files that are very similar to each other. Utilizing this similarity between files, the new BSdiff approach may generate an incremental update patch for a navigational database by only comparing new file data blocks with old file data blocks in related locations, resulting in less seek time.

For example, the old file may be divided into equally sized data blocks. The new file may also be divided into equally sized data blocks, preferably smaller in size. Overlapping data blocks may also be introduced for the old file, preferably twice, or approximately twice, the size of the data blocks in the new file. BSdiff operations may be performed between related data blocks from the two files, including the overlapping data blocks from the old file, to generate patch files for each data block in the new file. The resulting patch files are merged to generate a final patch file. The final patch size may be larger in size than a patch file generated by a standard BSdiff algorithm, however, the final patch file generated using the new BSdiff approach may greatly reduce the time required to perform the BSPatch algorithm on the target device.

For example, a target device may have only 32 megabytes of random-access memory (RAM). Using a standard BSdiff patch file, the BSPatch algorithm may take 50 hours or more to execute, with approximately 75% of that time spent on seek and read functions. For example, the 32 megabyte target device may take nearly 8 milliseconds to seek and read a data block from old file while applying the patch. Therefore, the BSPatch algorithm must seek and read 6826 times per 1 megabyte of the new file. Thus, for each megabyte, the BSPatch will take 54,608 milliseconds (i.e., 6826 freads multiplied by 8 milliseconds). However, using the new BSdiff approach, for example, the BSPatch algorithm must only seek and read a maximum of 2 times per 1 megabyte of the new file. Thus, seek and read functions may be reduced by 99%, allowing the BSPatch execute much faster. For example, the time necessary to apply a patch may be reduced from approximately 50 hours to approximately 50 minutes. To calculate the total number of seek and read functions required for the new BSdiff approach, the following equation may be used: freads=((new file size in megabytes)*2)/(8 megabytes). The old file normal block size is 8 megabytes. For example, an 80 megabyte new file may require 20 seek and read functions (freads).

Figure 4:
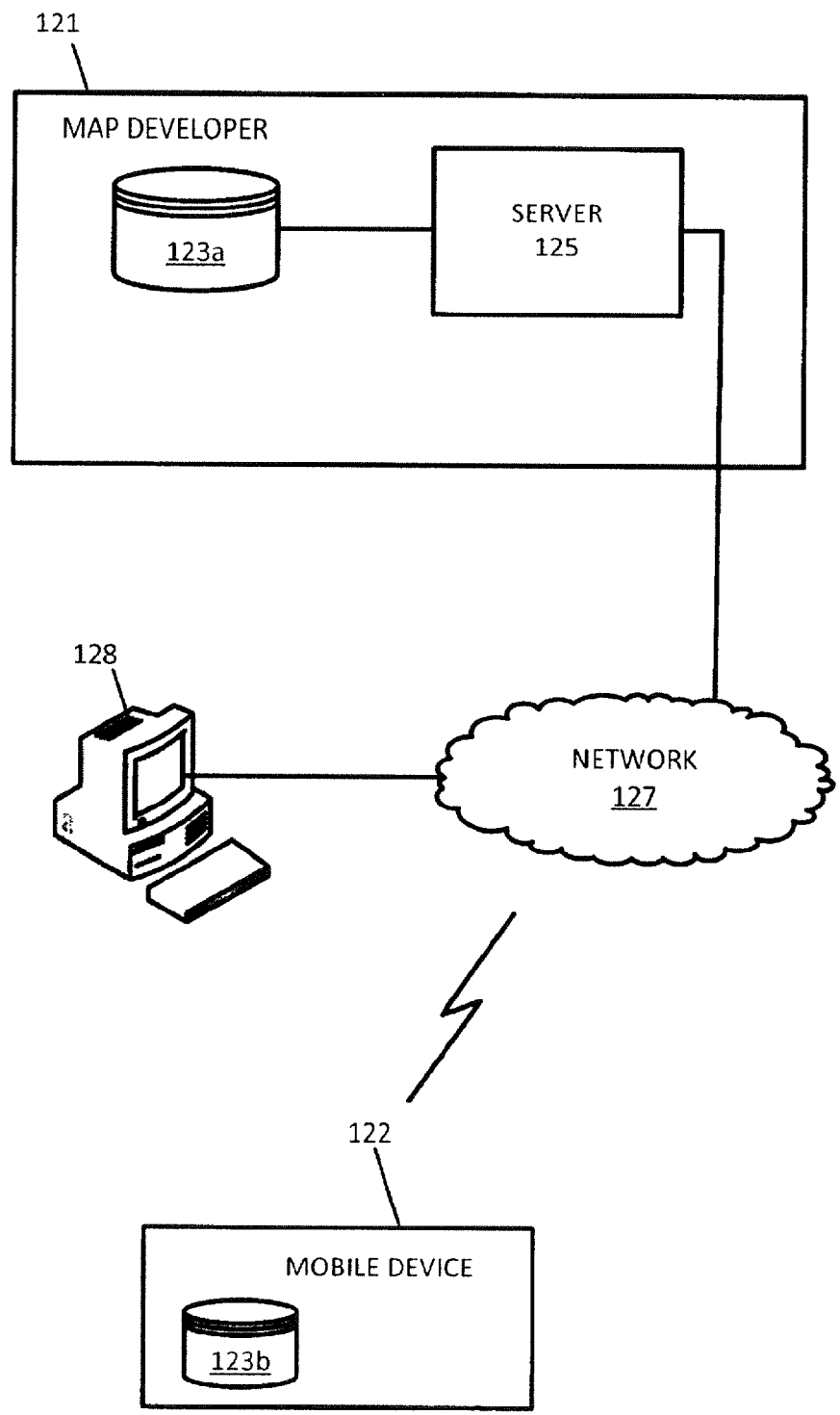
FIG. 4 illustrates an example map developer system according to an embodiment of the disclosed invention.

FIG. 4 illustrates an example map developer system 120 that may be used for updating navigation databases. The system 120 may include a developer system 121, one or more mobile devices 122 (e.g., navigation devices), a workstation 128, and a network 127. The developer system 121 includes a server 125 and one or more databases. The database 123a-b may be a geographic database including road links or segments. Additional, different, or fewer components may be provided. For example, many mobile devices 122 and/or workstations 128 may connect with the network 127.

As shown in FIG. 4, a master copy of the database 123a may be stored at the developer system 121, and a local copy of the database 123b may be stored at the mobile device 122. In one example, the local copy of the database 123b is a full copy of the geographic database, and in another example, the local copy of the database 123b may be a cached or partial portion of the geographic database. The cached portion may be defined based on a geographic location of the mobile device 122 or a user selection made at the mobile device 122.

The databases 123a-b may store or maintain geographic data such as, for example, road segment or link data records and node data records. The link data records are links or segments representing the roads, streets, or paths. The node data records are end points (e.g., intersections) corresponding to the respective links or segments of the road segment data records. The road link data records and the node data records may represent, for example, road networks used by vehicles, cars, and/or other entities.

Each road segment may be associated with two nodes (e.g., one node represents the point at one end of the road segment and the other node represents the point at the other end of the road segment). The node at either end of a road segment may correspond to a location at which the road meets another road, i.e., an intersection, or where the road dead-ends. The road segments may include sidewalks and crosswalks for travel by pedestrians.

Each of the road segments or links may be associated with various attributes or features stored in lists that are not byte aligned. The road segment data record may include data that indicate a speed limit or speed category (i.e., the maximum permitted vehicular speed of travel) on the represented road segment. The road segment data record may also include data that indicate a classification such as a rank of a road segment that may correspond to its functional class. The road segment data may include a segment ID by which the data record can be identified in the geographic database 123. The road segment data, nodes, segment IDs, attributes, fields, and other data may be organized in data structures described above.

The road segment data may include data identifying what turn restrictions exist at each of the nodes which correspond to intersections at the ends of the road portion represented by the road segment, the name or names by which the represented road segment is known, the length of the road segment, the grade of the road segment, the street address ranges along the represented road segment, the permitted direction of vehicular travel on the represented road segment, whether the represented road segment is part of a controlled access road (such as an expressway), a ramp to a controlled access road, a bridge, a tunnel, a toll road, a ferry, and so on. The additional road segment data may be organized in data tree structures. Alternatively, the data tree structures may be included in a separate database, for example, internal to the server 125 and/or the mobile device 122, or at an external location.

The server 125 may send map updates to the mobile device 122. The server 125 may update a particular tile of the geographic database 123. The server 125 may send updates to the master copy of the database 123*a* and/or send updates to the local copy of the database 123*b*. The server 125 may generate an update script or patch file for the navigation data and transmit the update script or patch file to the mobile device 122 to update the local copy of the database 123*b*.

The server 125 may be configured to perform a bytewise difference operation. The bytewise difference operation may be byte subtraction difference (BSdiff) operation, or a modified BSdiff operation. For example, server 125 may compare new file data blocks with old file data blocks from related locations in the files.

Server 125 may divide the old file is divided into equally sized data blocks and may divide the new file into equally sized data blocks. Preferably, the new file data blocks are smaller than the old file data blocks. To make additional matches, server 125 may also introduce overlapping data blocks for the old file spanning between two data blocks of the old file. Preferably, the overlapping data blocks are twice the size of the new file data blocks. Server 125 may then perform BSdiff operations between the new data blocks and the corresponding old file data blocks, including the overlapping data blocks if they were introduced. To make more matches, a right and left focus may be add additional new file data blocks that correspond to the old file data blocks. The server 125 may store the results of the BSdiff operations in navigation patch files. The resulting navigation patch files may be merged into a final navigational patch file. The final navigation patch file may be stored in the geographic database 123*a*.

The mobile device 122 may be a personal navigation device ("PND"), a portable navigation device smart phone, a mobile phone, a personal digital assistant ("PDA"), a tablet computer, a notebook computer, and/or any other known or later developed mobile device or personal computer. The mobile device 122 may also be an automobile head unit, infotainment system, and/or any other known or later developed automotive navigation system. Non-limiting embodiments of navigation devices may also include relational database service devices, mobile phone devices, car navigation devices, and navigation devices used for air or water travel.

The mobile device 122 may be configured to execute routing algorithms to determine an optimum route to travel along a road network from an origin location to a destination location in a geographic region. Using input from the end user, the mobile device 122 examines potential routes between the origin location and the destination location to determine the optimum route. The mobile device 122 may then provide the end user with information about the optimum route in the form of guidance that identifies the maneuvers required to be taken by the end user to travel from the origin to the destination location. Some mobile devices show detailed maps on displays outlining the route, the types of maneuvers to be taken at various locations along the route, locations of certain types of features, and so on.

The mobile device 122 may also be configured to execute an update script or navigation patch file using locally stored map data. The mobile device 122 may receive the update script and/or navigation patch file from the server 125 by way of network 127. The update script or patch file may include less data than a wholesale replacement the database, a portion of the database or a BLOB, and requires less bandwidth and/or transmission time than the wholesale replacement. The update script and/or patch file may be stored in a computer readable medium coupled to the server 125 or the navigation device 122.

The developer system 121, the workstation 128, and the mobile device 122 are coupled with the network 127. The phrase "coupled with" is defined to mean directly connected to or indirectly connected through one or more intermediate components. Such intermediate components may include hardware and/or software-based components.

The computing resources may be divided between the server 125 and the mobile device 122. In some embodiments, the server 125 performs a majority of the processing for generating the final navigational patch file. In other embodiments, the mobile device 122 or the workstation 128 performs a majority of the processing. In addition, the processing may be divided substantially evenly between the server 125 and the mobile device 122 or workstation 128.

Figure 5:
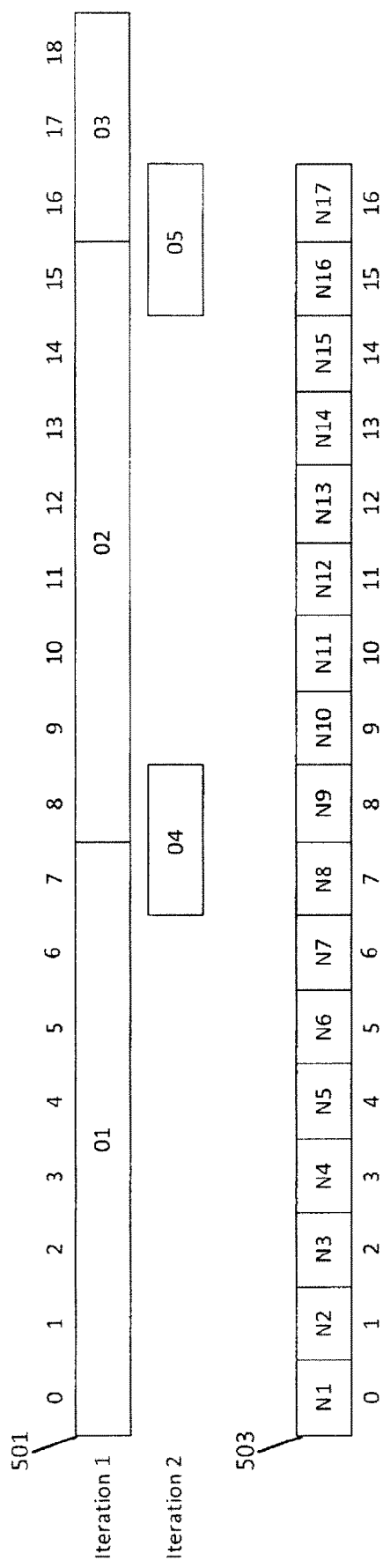
FIG. 5 illustrates an example of data blocks used for a BSdiff operation according to an embodiment of the disclosed invention.

FIG. 5 illustrates an example of data blocks used for a BSdiff operation according to an embodiment of the disclosed invention. In one example, the old file 501 is 19 megabytes and the new file 503 is 17 megabytes. The BSdiff operation may be performed in two iterations. In the first iteration, the BSdiff operation may be performed with the old file data blocks. In the second iteration, the BSdiff operation may be performed with the overlapping data blocks. For iteration 1, the old file may be divided into data blocks represented by 01, 02 and 03. The old file data blocks may be equally sized with a predetermined length (e.g., 8 megabytes). For iteration 2, the overlapping data blocks are introduced and may be represented by 04 and 05. Each overlapping data block may be equally sized with a predetermined length (e.g., 2 megabytes). In one example, the overlapping data blocks may be twice the size of the new data blocks. In another example, the overlapping data blocks may the same predetermined length as the new file data blocks (e.g., 8 megabytes). The overlapping data block size may be modifiable. Typically, the overlapping data blocks are smaller than the old data blocks and larger than the new file data blocks. In another example, unequally sized overlapping data blocks may be introduced. For example, the last overlapping data block may be a larger or smaller than other overlapping data blocks. The overlapping data blocks may be introduced at the boundaries of the old data blocks, typically lying equally across two old data blocks. In one example, an overlapping data block may be lie unequally across two old data blocks. For example, the last overlapping data block may lie farther over the preceding old data block than the last old data block (e.g., if the last old data block is smaller than the preceding old data block). The new file may be divided into data blocks represented by N1 to N17. The new file data blocks may be equally sized with a predetermined length (e.g., 1 megabyte).

FIG. 6 illustrates data block sizes and data block starting indexes for the example in FIG. 5. FIG. 500 shows that data blocks 01, 02 and 03 may be a predetermined size (e.g., 8, 8 and 3 megabytes long, respectively). Data block 03 may be only 3 megabytes long because only 3 megabytes remain in the old file when the old file is divided by the predetermined size (e.g., 8 megabytes). Data blocks 04 and 05 are both a predetermined size (e.g., 2 megabytes long). The start index of data blocks 01, 02, 03, 04 and 05 are 0, 8, 16, 7 and 15, respectfully. In one example, the old data blocks, the new data blocks and the overlapping old data blocks may be identified and stored in one or more tables storing references to the size and starting index of the data blocks (e.g., table 500). Alternatively, the old data blocks, the new data blocks and the overlapping old data blocks may be stored as separate files from the old file and new file. The size of the old data blocks, the new data blocks and the overlapping old data blocks may be determined by default settings, by file type, and/or by user input.

Each old data block may be compared with corresponding new data blocks (e.g., 8 new data blocks) and each overlapping data block may be compared with corresponding new data blocks (e.g., 2 new data blocks). In the interest of finding more matches, a left focus technique and a right focus technique may be introduced. A left and right focus may identify more matching data blocks in the old file. A left focus represents how many new data blocks immediately preceding the related new data blocks that will be compared with the old data block. A right focus represents how many new data blocks immediately following the corresponding new data blocks that will be compared with the old data block. The higher the right and left focus, the longer the BSdiff algorithm will take to generate the patch files.

Figure 7:
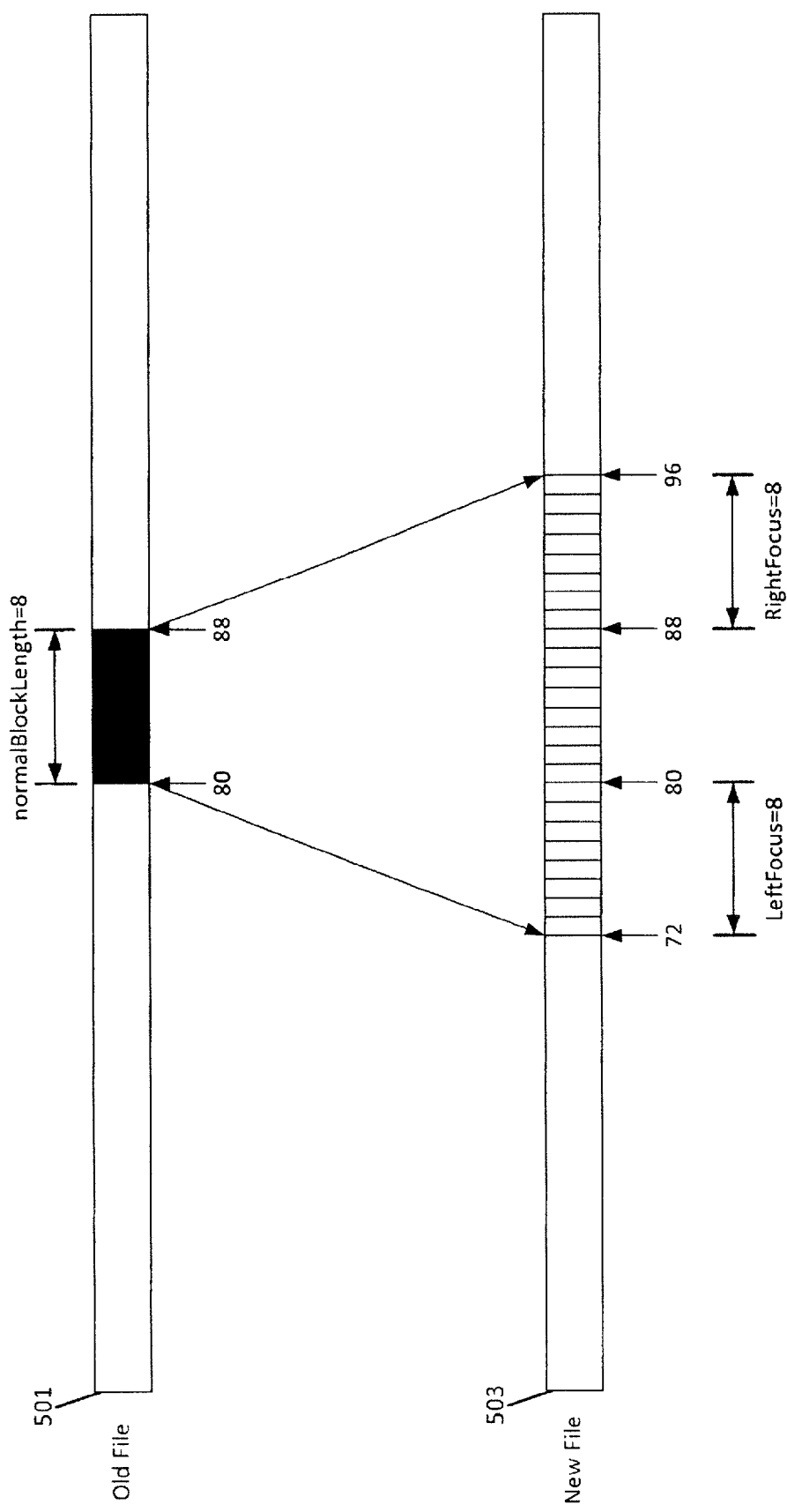
FIG. 7 illustrates an example of a right and left focus according to an embodiment of the disclosed invention.

FIG. 7 illustrates an example of a right focus and left focus according to an embodiment of the disclosed invention. In this example, an 8 megabyte (i.e., normalBlockLenth=8) old file data block from old file 501 begins at index 80 is compared to the corresponding new file data blocks at the same location in the new file 503, at indexes 80 to 87. The old file data block is also compared to the left and right focus. In this example, the left focus is 8 megabytes long (i.e., LeftFocus=8) and the right focus is 8 megabytes long (i.e., RightFocus=8). The left focus begins at index 72 and the right focus begins at index 88, immediately preceding and following the new file data blocks at the same location as the old data block.

In the example provided in FIG. 7, each old data block may be compared with 24 new data blocks: the 8 new data blocks in the same index location as the old data block; 8 new data blocks immediately preceding the index location of the old data block; and 8 new data blocks immediately following the index location of the old data block. These comparison operations may result in 24 separate patch files for the new file blocks. Similarly, each overlapping old data block may be compared to 18 new data blocks: the 2 new data blocks in the same index location as the overlapping old data block; 8 new data blocks immediately preceding the index location of the overlapping old data block; and 8 new data blocks immediately following the index location of the overlapping old data block. These comparison operations may result in 18 separate patch files for the new data blocks. The following formula may be used to determine how many patch will be generated for the new data blocks when a right and left offset is used: Number of Patch Files=(normalBlockLength+RightFocus+LeftFocus)/newBlockLength. Where: normalBlockLength=old data block size; RightFocus=right focus size; LeftFocus=left focus size; and newBlockLength=new data block size. For this example, the normalBlockLength, RightFocus and LeftFocus may be a multiple of the newBlockLength. The resulting patch files may be in the same format as standard BSdiff patch files. Standard BSdiff patch files are discussed above. The process will typically span the entire old file.

The last old data block may be compared with more or fewer new data blocks, depending on the size of the new and old files. For example, for last old data block and for last overlapping old data block, the operations may ensure that a comparison is made to the entire new file. For example, if the old file size is 12 megabytes and new file size is 24 megabytes, the BSdiff operations may ensure that the last old data block and the last overlapping old data block are compared through the end of the new file. In this example, the operations may ensure that the comparison does not end at new file index 20, but instead continues through index 24. In some cases, when the old and new file size are dissimilar in length, transmitting the entire new file may be advantageous over an incremental update using a patch file.

The comparison operations as discussed above may compare a new data block with more than one old data block, resulting in more than one patch file for each new data block. In this case, the respective patch file sizes for each new data block are compared and the patch file with the smallest patch file may be selected and stored (i.e., temp_XXX.path, where XXX represents the new file data block number). The smallest patch file sizes may also be stored in an arrays for later use. Typically, the smallest patch file provides the best match for the new data block from the corresponding old data blocks. In one example, every patch file for each new data block may be stored, and the smallest patch file for each may be selected from the various patch files after the new file has be processed completely. In another example, only one patch file is stored for each new data block, and the currently stored patch file for a new data block may be replaced and overwritten by a smaller patch file when the smaller patch file is generated. By overwriting the currently stored patch files with smaller patch files, the smallest patch file may remain stored for each new file data block when the comparison operations are complete.

FIG. 8 illustrates an example data block array for a 17 megabyte new file. For example, in table 502, three arrays may be stored, each with 17 entries corresponding to the 17 new file data blocks, when each new data block is 1 megabyte long. The first array may hold the patch size for the best matching patch file for each new data block. The patch size is the byte size of the best matching patch file. A smaller patch file corresponds results from a greater amount of data concatenated directly from the old file (i.e. using the Diff block), where a larger patch file corresponds to more new data that may not be concatenated from the old file (i.e., using the Extra block). The second array may hold the best matching old data block number for the best matching patch file for each new data block. The third array may hold the best matching old block size for the best matching patch file for each new data block.

The patch files generated for the new data file blocks may be merged or combined to generate a final or merged patch file for the new file which may be utilized by a navigation device (i.e., using BSPatch). For example, the arrays and patch files, as discussed above, may be used to generate the merged patch file. Preferably, the smallest patch file for each new file data block is selected. The merging operations may utilize the respective Control blocks, Diff blocks and Extra blocks from each patch file to generate an appropriate Header, Control block, Diff block and Extra block for the final patch file. The merging operations may merge the respective Control blocks, Diff blocks and Extra blocks separately, and later merge each into the final patch file.

The Control blocks from the respective patch files may be directly concatenated. No changes to the Control blocks are necessary, except for the last Control block of each respective patch file. The last control block of each patch file may be updated to provide the seek offset value for the best matching old data block starting index of the next patch file to be merged. For example, for the last Control block of a patch tile, the seek offset value in BSpatch (i.e., OldPos) may be set to the best matching old file data block for the next new data block patch file. An additional Control block row (i.e., ctrl0=0; ctrl1=0; ctrl2=offset) may also be added to the beginning of the Control block, where the seek offset (i.e., ctrl2) may be set to the best matching old data block of the first new data block.

The Diff blocks and Extra blocks from the respective patch files may also be directly concatenated. No changes to the Diff or Extra blocks are necessary. The Header information in the final patch file may be updated to reflect the final Control block size, Diff block size and new file size. After the merging operations are complete, the respective patch files are no longer needed and may be deleted to free up memory. The final or merged patch file may be in the same format as standard BSdiff patch files, allowing the final patch file to be utilized by existing BSPatch algorithms. Standard BSdiff patch files and BSPatch algorithms are discussed above. Because the respective patch files resulted from comparisons to related locations in old file, only portions of the old file must be loaded into the device buffer. Hence, the memory requirement of BSPatch may be reduced to below a target level (e.g., 10 MB).

Figure 9:
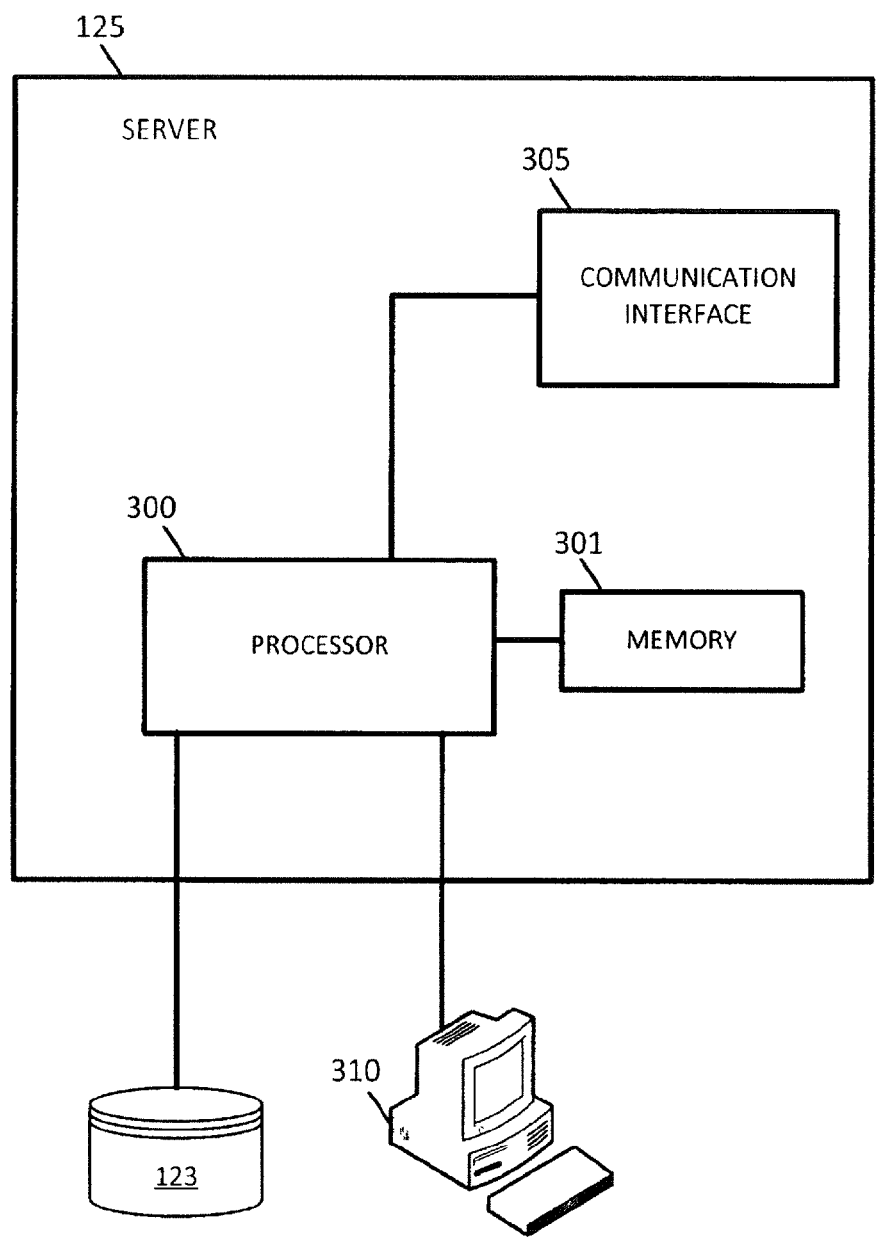
FIG. 9 illustrates an example server of the map developer system according to an embodiment of the disclosed invention.

FIG. 9 illustrates an example server 125. The server 125 includes a processor 300, a communication interface 305, and a memory 301. The server 125 may be coupled to a database 123 and a workstation 310. The workstation 310 may be used to enter data regarding the type of update script that will be used (e.g., standard BSdiff versus BSdiff using related data blocks). The database 123 may be a geographic database as discussed above. Additional, different, or fewer components may be provided in the server 125.

Figure 10:
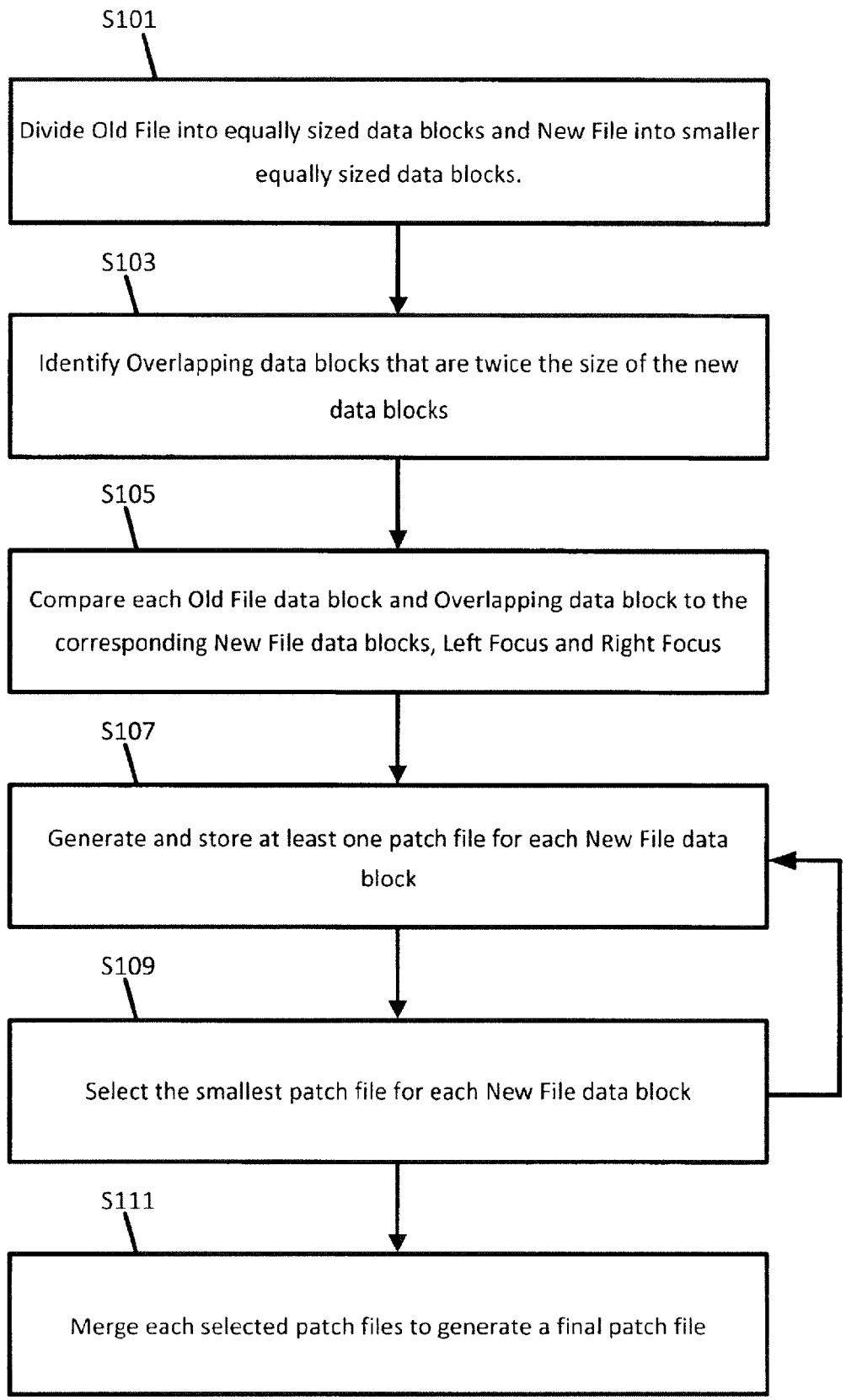
FIG. 10 illustrates an example flowchart for the server device of FIG. 9 according to an embodiment of the disclosed invention.

FIG. 10 illustrates an example flowchart for the operation of server 125 of the system of FIGS. 4 and/or 9 according to an embodiment of the disclosed invention. Additional, different, or fewer acts may be provided. In act S101, the processor 300 divides an old file into equally sized data blocks and divides a new file into equally sized data blocks. For example, the processor 300 may divide the old file into larger data blocks (i.e., 8 megabytes) than the new file (e.g., 1 megabyte). The last data block of the old file may be smaller than the equally sized data blocks, because the size of the old file may not be a multiple of the data block size, leaving a smaller data block as a remainder.

At act S103, the processor 300 identifies overlapping data blocks. For example, the processor 300 may identify overlapping data blocks that lie equally across the boundaries of the old file data blocks. The overlapping data blocks may be twice the size of the new data blocks (e.g., 2 megabytes).

At act S105, the processor 300 compares each old file data block to related new file data blocks and each overlapping data block to related new file data blocks. In one example, processor 300 introduces a left and right focus to find more matches, where the left and right focus identifies additional new data blocks to be compared to the old file data blocks and the overlapping data blocks. The left and right focus may be any size, however it may be preferable for the left and right focus to be the same size as the old data blocks (e.g., 8 megabytes).

At act S107, the processor 300 generates and stores in memory 301 at least one patch file for each new file data block.

At act S109, the processor 300 selects the smallest patch file for each new file data block. In another example, when a smaller patch file is generated for a new file data block, the memory 204 stores the smaller patch file overwriting the previously generated patch file for the new data block. Acts S107 and S109 may be repeated until the entire new file has been processed.

At act S111, the processor 300 merges the selected patch files to generate a final patch file. The navigation patch file may be sent to the mobile device 122, or any navigation device, upon a received request or according to a time schedule. The merged navigation patch file may be later divided in order to apply the patch file in a series of stages. For example, in some examples the patch file may be too large for particular systems to receive all at once.

Figure 11:
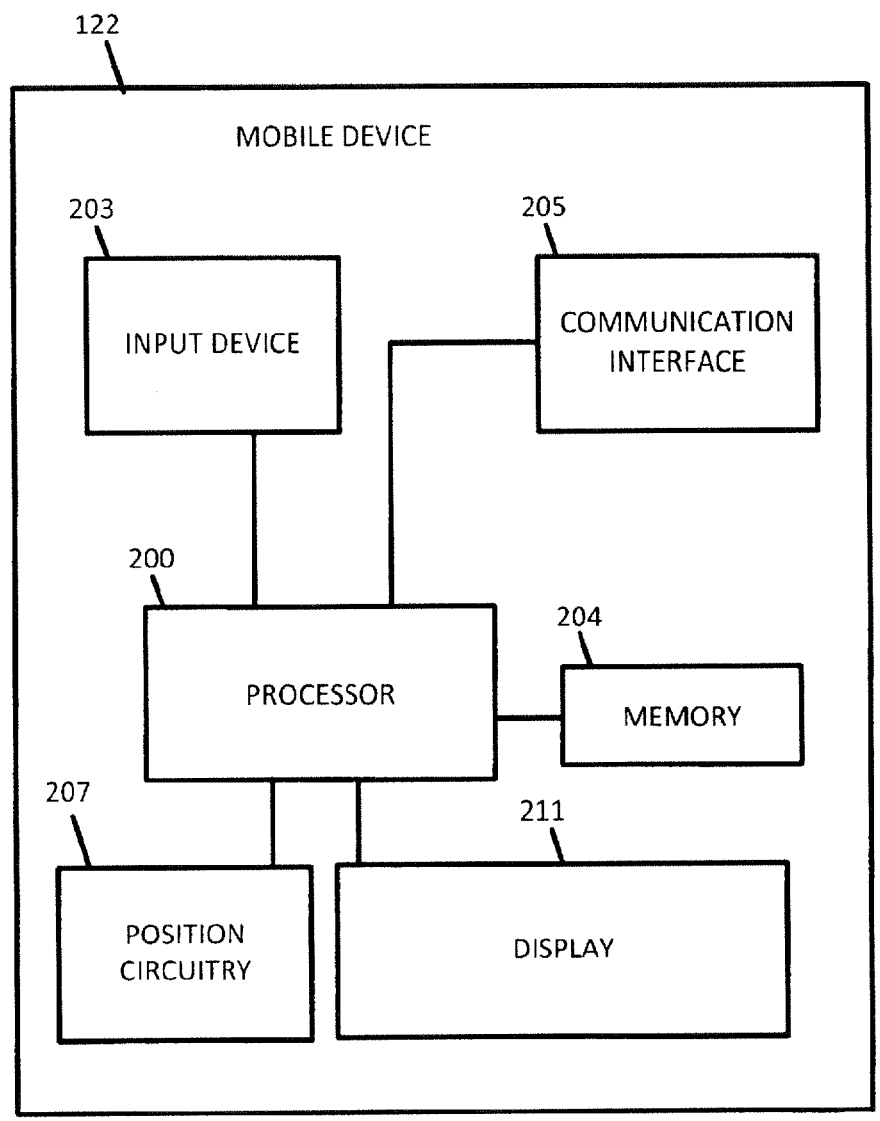
FIG. 11 illustrates an example mobile device in communication with the map developer system according to an embodiment of the disclosed invention.

FIG. 11 illustrates an exemplary mobile device 122 of the system of FIG. 4 according to an embodiment of the disclosed invention. The mobile device 122 includes a processor 200, a memory 204, an input device 203, a communication interface 205, position circuitry 207, and a display 211. Additional, different, or fewer components are possible for the mobile device 122.

The processor 200 may execute the navigational patch file on a set of navigation data stored in memory 204. The set of navigation data may be an entire geographic database. The set of navigation data may be a subset of the geographic database. For example, the subset may be cached according to the geographic position of the mobile device 122. For example, the position circuitry 207 may determine the geographic position (e.g., latitude and longitude) and request the set of navigation data from the server 125 accordingly. In another example, the user may select a geographic region to be loaded in the memory 204 through the user input 203.

The positioning circuitry 207 may include a Global Positioning System (GPS), Global Navigation Satellite System (GLONASS), or a cellular or similar position sensor for providing location data. The positioning system may utilize GPS-type technology, a dead reckoning-type system, cellular location, or combinations of these or other systems. The positioning circuitry 207 may include suitable sensing devices that measure the traveling distance, speed, direction, and so on, of the mobile device 122. The positioning system may also include a receiver and correlation chip to obtain a GPS signal. Alternatively or additionally, the one or more detectors or sensors may include an accelerometer built or embedded into or within the interior of the mobile device 122. The accelerometer is operable to detect, recognize, or measure the rate of change of translational and/or rotational movement of the mobile device 122. The mobile device 122 receives location data from the positioning system. The location data indicates the location of the mobile device 122.

The input device 203 may be one or more buttons, keypad, keyboard, mouse, stylist pen, trackball, rocker switch, touch pad, voice recognition circuit, or other device or component for inputting data to the mobile device 100. The input device 203 and the display 211 may be combined as a touch screen, which may be capacitive or resistive. The display 211 may be a liquid crystal display (LCD) panel, light emitting diode (LED) screen, thin film transistor screen, or another type of display.

The controller 200 and/or processor 300 may include a general processor, digital signal processor, an application specific integrated circuit (ASIC), field programmable gate array (FPGA), analog circuit, digital circuit, combinations thereof, or other now known or later developed processor. The controller 200 and/or processor 300 may be a single device or combinations of devices, such as associated with a network, distributed processing, or cloud computing.

The memory 204 and/or memory 301 may be a volatile memory or a non-volatile memory. The memory 204 and/or memory 301 may include one or more of a read only memory (ROM), random access memory (RAM), a flash memory, an electronic erasable program read only memory (EEPROM), or other type of memory. The memory 204 and/or memory 301 may be removable from the mobile device 122, such as a secure digital (SD) memory card.

The communication interface 205 and/or communication interface 305 may include any operable connection. An operable connection may be one in which signals, physical communications, and/or logical communications may be sent and/or received. An operable connection may include a physical interface, an electrical interface, and/or a data interface. The communication interface 205 and/or communication interface 305 provides for wireless and/or wired communications in any now known or later developed format.

The network 127 may include wired networks, wireless networks, or combinations thereof. The wireless network may be a cellular telephone network, an 802.11, 802.16, 802.20, or WiMax network. Further, the network 127 may be a public network, such as the Internet, a private network, such as an intranet, or combinations thereof, and may utilize a variety of networking protocols now available or later developed including, but not limited to TCP/IP based networking protocols.

Figure 12:
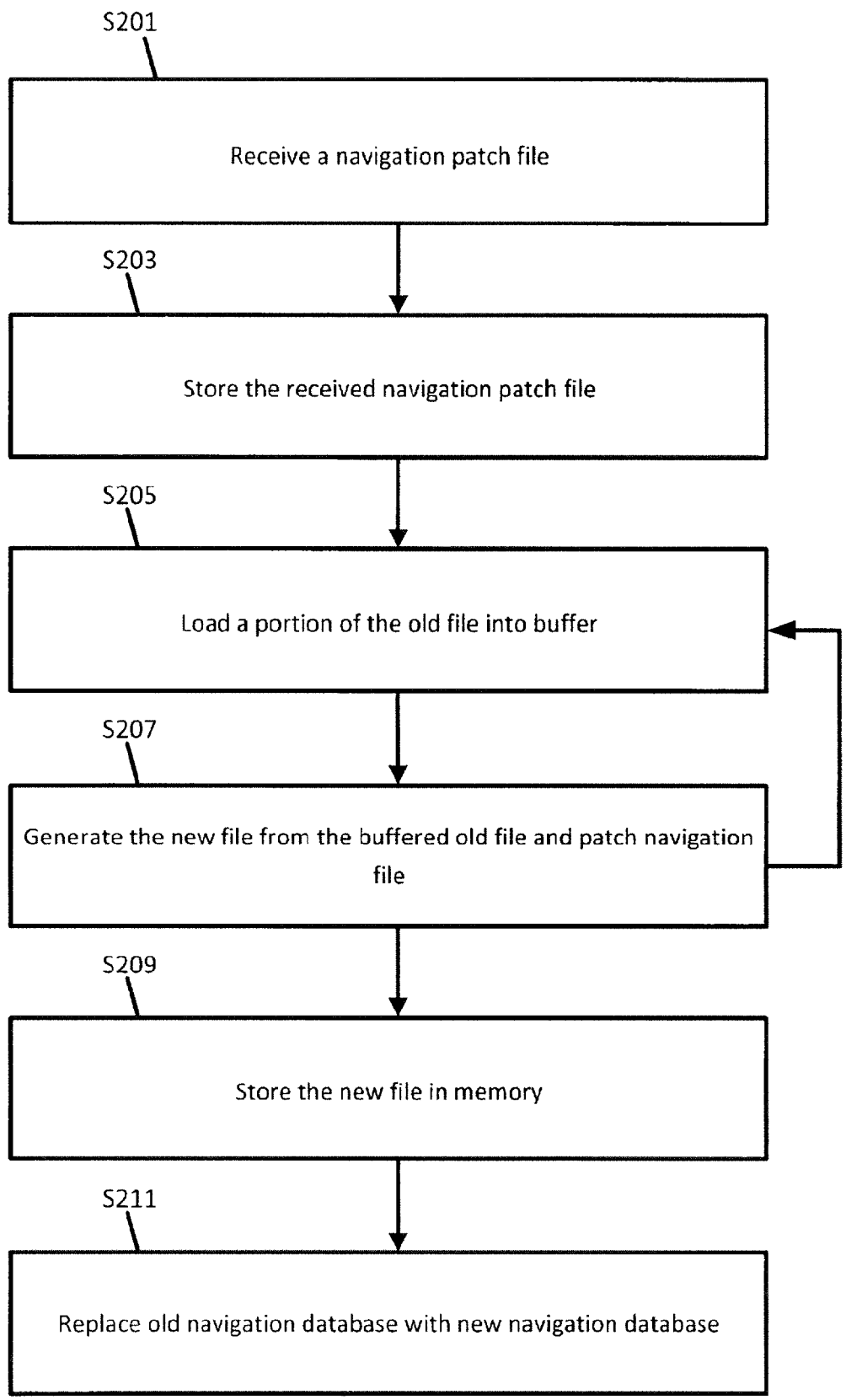
FIG. 12 illustrates an example flowchart for the mobile device of FIG. 11 according to an embodiment of the disclosed invention.

FIG. 12 illustrates an example flowchart for the operation of mobile device 122 according to an embodiment of the disclosed invention. Additional, different, or fewer acts may be provided. At act S201, the communication interface 205 or processor 200 may receive an update script or navigational patch file from the server 125. The patch file may be received based on a request sent by the communication interface 205 through the network 127 based on instructions from the user input 203. The patch file may be received based on a scheduled update. For example, updates may be sent weekly, monthly, or quarterly. In one example, the schedule is defined by the mobile device 122. In another example, the schedule is defined according to a subscription or an online purchase. At act S203, the memory 204 stores the received patch file.

At act S205, the processor 200 loads at least a portion of the old file into buffer. In one example, the portion loaded into buffer corresponds to the seek offset position from the first Control block (i.e., Ctrl2). In another example, processor 200 may also load the entire old file into buffer. At act S207, the processor 200 generates the new file from the buffered portion of the old file portion and the patch file. The memory requirement is reduced irrespective of file size but dependent on the block size used to break up the file. The memory requirement may be calculation using equation 1:

$$\max(17*n, 9*m+8)+8*(p/m)*3+p+0(1) \text{ bytes} \quad \text{Eq. 1,}$$

where n=old file normal block size,
m=new file normal block size,
p=new file size.

Therefore, if an 8 MB (n) block size was used in the old file and a 1 MB (m) new bock size was used, the first term of equation 1 provides max(17*8, 9*1+8)=max(136, 17)=136 MB for creating temp patch files. The second term of equation 1 provides the space for merging. Thus, in this example, the memory requirement, as a function of the new file size, is 136 MB+25*p.

The standard BSPatch algorithm may be used to generate the new file. The BSPatch algorithm may read an old normal block size at one and read and write one new block size at a time. In one example, when processor 200 must read from a portion of the old file that is not loaded into the buffer, acts S205 and S207 may be repeated. At act S205, the processor 200 may a different portion of the old file is loaded into buffer. At act S207, the processor 200 continues to generate the new file reading from the newly buffered portion of the old file. At act S209, the memory 204 stores the new file in memory. The new file may be a new navigation database, or a portion thereof.

At act S211, the processor 200 replaces the old navigation database with the new file database. The replacement step of act S211 may repeated for multiple objects updated by the navigational patch file. The processor 200 may test the navigational database after the bits are inserted. The test may be an integrity check, a parity check, or a routing algorithm that is applied to the updated navigational data. When the test is successful, the update is made permanent and an acknowledgement is presented by the display 211. When the test is unsuccessful, the update may be reversed an error message may be presented on display 211.

Figure 13:
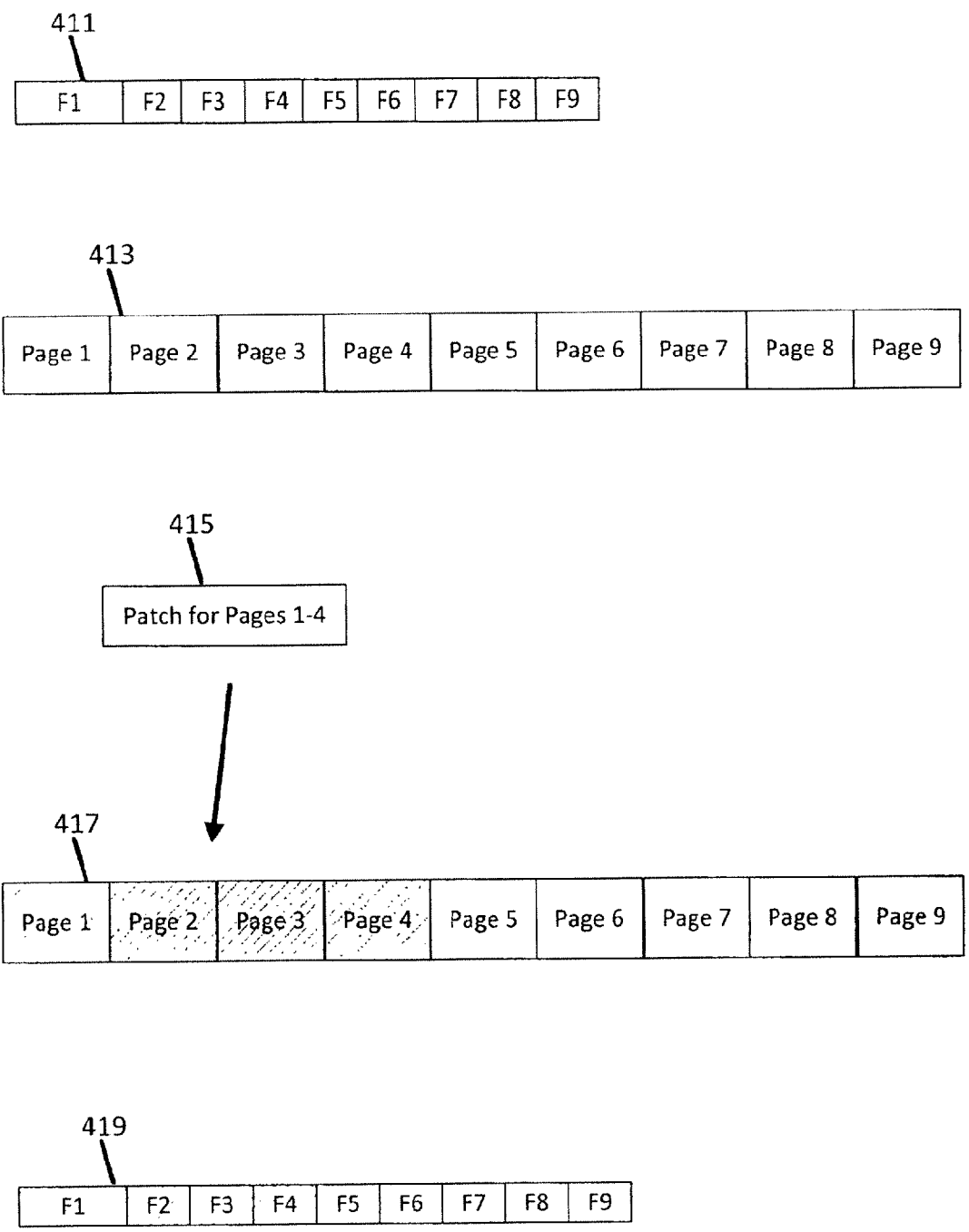
FIG. 13 illustrates an example patch file application to a navigational database.

FIG. 13 illustrates an example patch file application to a navigational database. The navigational database files for a large area such as the United States or Europe may be very large (e.g., 30 gigabytes). In order for the navigational database to be usable, which means that information at any location in the navigation database can be access randomly and quickly, the navigational database cannot be compressed as a whole.

Accordingly, the navigation database is organized in blocks or pages. The blocks are compressed individually with a compression algorithm. Example compression algorithms include zlib, gzip, or deflate. If a caller issues a query, the query is transformed into a sequence of read operations. Each read operation reads a fixed length of binary information from the navigational database file. The fixed length may correspond to a page or a block. The fixed length may be any size (e.g., 1 kilobyte or 32 kilobytes). The read operations may be derived from individual SQL queries. An example SQL query is "select ndsdata from routingtiletable where id=12345." The SQL query may be transformed to a series of page calls: (1) read page 6577, (2) read page 6124, and (3) read page 243. The ndsdata queried is read from the respective pages and returned to the caller that issued the query.

FIG. 13 illustrates a series of compressed pages 411 (F1, F2, F3 . . . ). The first page F1 is illustrated as larger than the other pages to represent that the first page may remain uncompressed. The first page may include metadata such as the identity of the compression algorithm and the starting point of the compressed pages. An alphanumeric identification value may be assigned to different compression algorithms (e.g., 1=zlip, 2=gzip, etc.). The starting point of the compressed may be an address or file pointer in the database for the first page, the second page, or each of the pages in the navigation database file. When only the address of one page is included, addresses of subsequent pages may be inferred from the fixed length sizes of the pages.

The processor 200 may read the first page to determine the address or index value of one or more pages and the compression algorithm used. The compression algorithm is run to decompress the one or more pages into memory 204. The series of compressed pages 411 are decompressed to decompressed pages 413.

The processor 200 applies patch file 415 for pages 1-4 to the decompressed pages 413, creating the updated uncompressed navigation file 417. After the patch is applied, the processor 200 runs the compression algorithm to create a new updated compressed navigation file 419.

Figure 14:
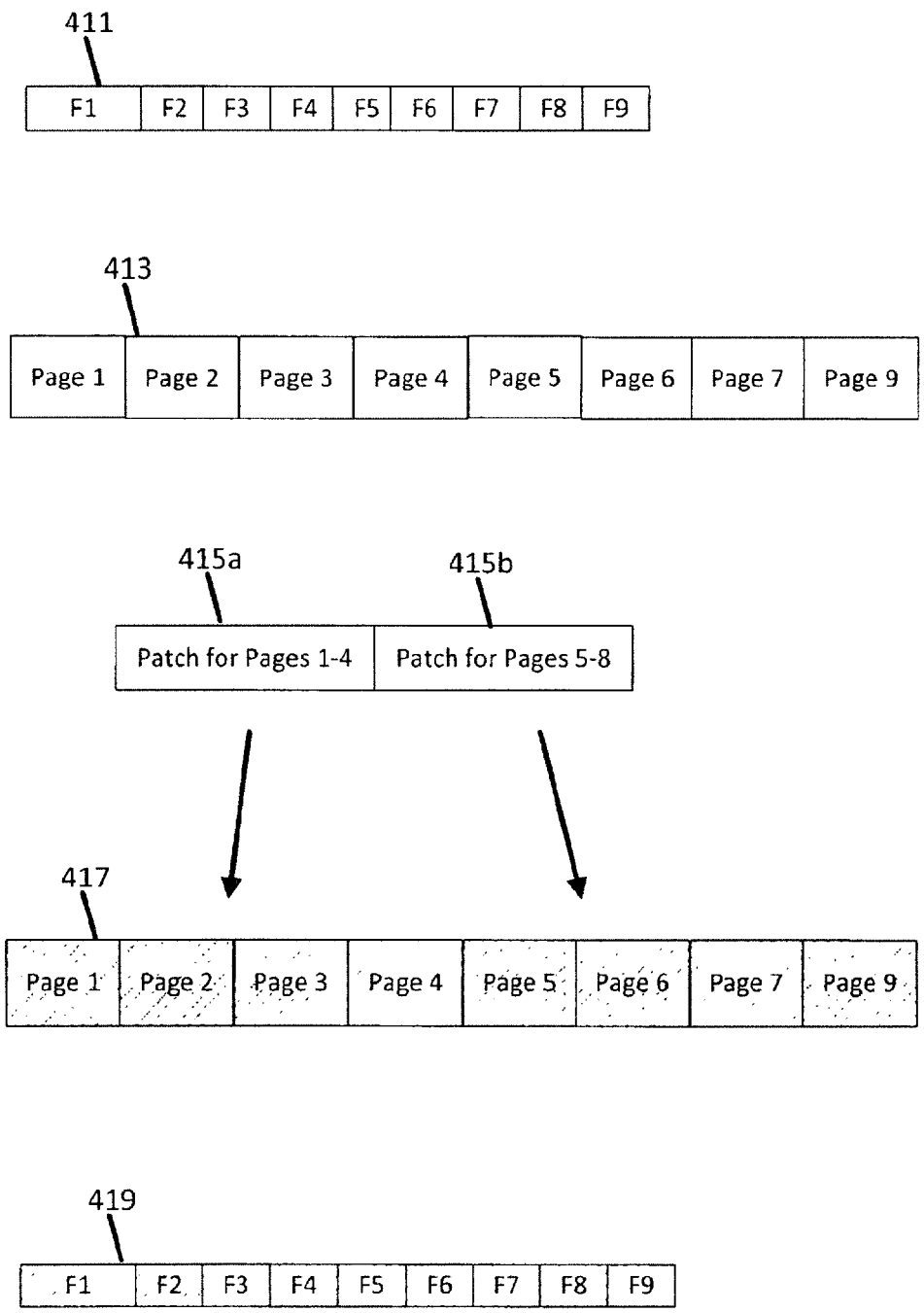
FIG. 14 illustrates an example sequence of patch file applications.

FIG. 14 illustrates an example sequence of patch file applications. A series of compressed pages 411 (F1, F2, F3 . . . ) are divided into multiple patches. The processor 200 may read the first page F1 to determine the address for each patch. In the example shown in FIG. 14, pages F1-F4 correspond to patch 415a and pages F5-F8 correspond to patch 415b. After decompressing pages 411 into decompressed pages 413, patch 415a is applied to pages 1-4 of the decompressed pages 413, and patch 415b is applied to pages 5-8 of the decompressed pages 413.

However, in order to reduce the amount of memory required for this operation, the patches 415a-b are applied serially and individually. Any number of patches may be used. The patches may be ordered randomly or in a predetermined sequence. For example, pages F1-F4 are decompressed, patch 415a is applied, then the updated pages 1-4 of uncompressed navigation file 417 are compressed back to pages 1-4 of compressed navigation file 419. Subsequently, or at a later time, pages F5-F8 are decompressed, patch 415b is applied, the updated pages 5-8 of uncompressed navigation file 417 are compressed back to pages 5-8 of compressed navigation file 419. The two portions are merged the single compressed navigation file 419.

Figure 15:
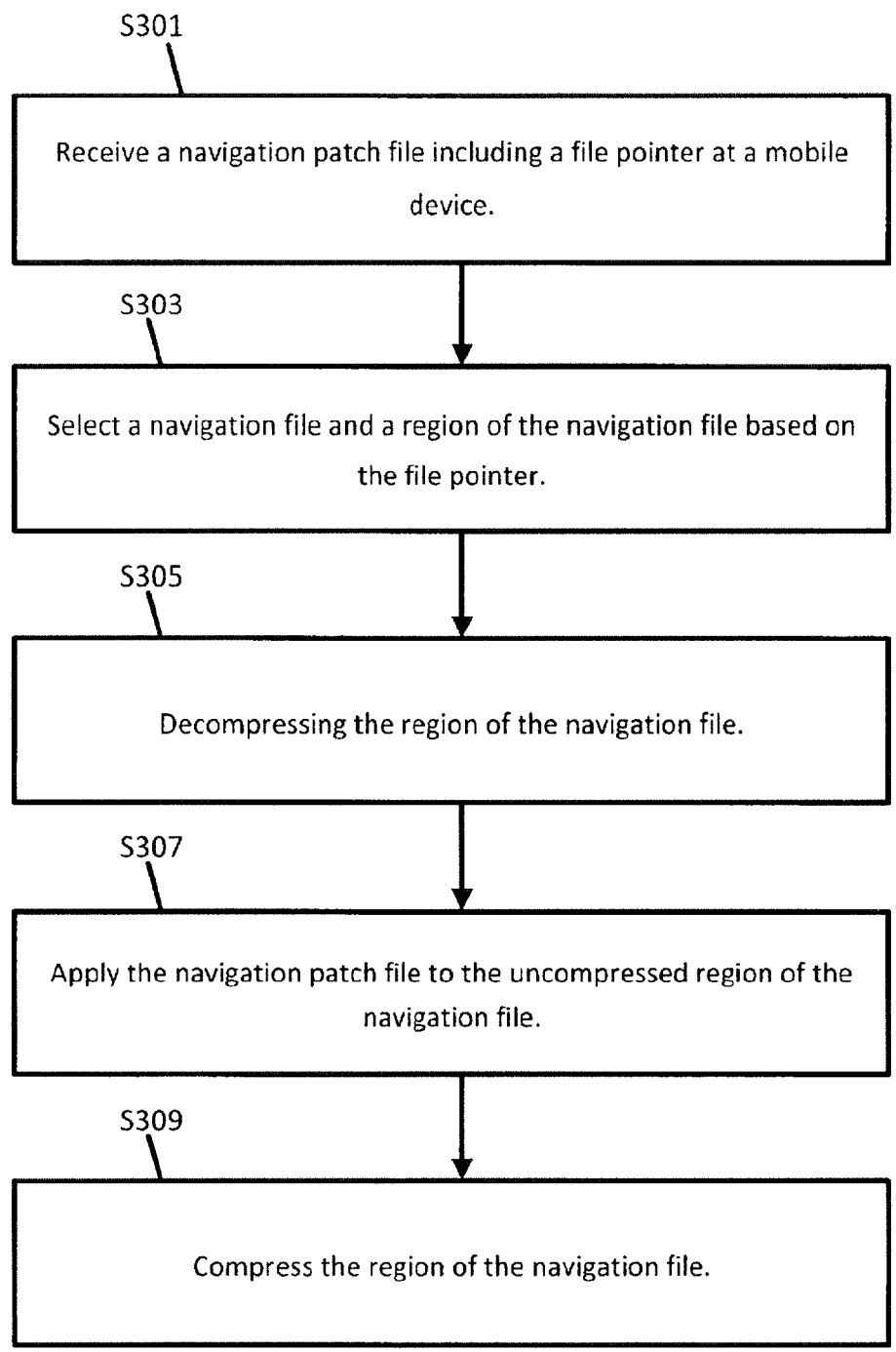
FIG. 15 illustrates an example flowchart for applying a patch file to a navigational database.

FIG. 15 illustrates an example flowchart for applying a patch file to a navigational database. Additional, different, or fewer acts may be provided. The acts are performed in the order shown or other orders. The acts may also be repeated.

At act S301, the processor 200 or the communication interface 205, receives a navigation patch file including a file pointer at a mobile device. The file pointer may be included in metadata in the first page of the navigation file. The file pointer may be a memory index or memory address. The navigation patch file may be sent by server 125.

Act S301 may be repeated such that the processor 200 or the communication interface 205 receives first and second navigation patch files from the server 125 over time. The elapsed time between patch files may correspond to the time require to apply the previous patch file.

At act S303, the processor 200 selects a navigation file and a region of the navigation file based on the file pointer. The metadata may include a file pointer for each subset of the pages or region of the navigation file. For example, one file pointer may be used for pages 1-4 and another file pointer may be used for pages 5-8. The subset of pages may be different sizes. The number of pages may be determined by the maximum patch size (e.g., in bytes), which may be set based on the size of memory 204 or an allocated portion of memory 204. The maximum patch size may be set by a user input or be predetermined.

At act S305, the processor 200 decompresses the region of the navigation file. The processor 200 may determine what compression algorithm to use based on the metadata of page 1. Alternatively, the compression algorithm used may be predetermined.

At act S307, the processor 200 applies the navigation patch file to the decompressed region of the navigation file. The navigation patch file is based on bytewise difference operations between different versions of the navigation file. For example, the patch file may be previously generate according to any of the examples herein. First, an old and new version of the region of the navigation file are compared. Second, the region of the navigation file is read into memory buffer. The new file is read byte by byte to identify the best match within the entirety of the old file. New bytes and matching byte differences are identified and stored.

At act S309, the processor 200 compresses the region of the navigation file. The compression algorithm may be the same algorithm selected in S305. Acts S301-S309 may be repeated for any number of additional regions of the navigation file. For example, the processor 200 may receive a second navigation patch file including a second file pointer, select a second region of the navigation file based on the second file pointer, decompress the second region of the navigation file, apply the second navigation patch file to the uncompressed second region of the navigation file, and compress the second region of the navigation file.

The size of memory 204 is less than a combined size of the uncompressed first region of the navigation file and the uncompressed second region of the navigation file. Thus, memory 204 can be smaller than would be possible if the first region and the second region were patched in parallel.

The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. These examples may be collectively referred to as a non-transitory computer readable medium.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit.

Accordingly, the present system encompasses software, firmware, and hardware implementations.

In accordance with various embodiments of the present disclosure, the methods described herein may be implemented by software programs executable by a computer system.

Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

As used in this application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor receives instructions and data from a read only memory or a random access memory or both. The essential elements of a computer are a processor for performing instructions and one or more memory devices for storing instructions and data. Generally, a computer also includes, or is operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

The following example embodiments of the invention are also disclosed:

Embodiment 1

A method comprising:
identifying, using a processor, a plurality of equally sized data blocks of a first navigation file;
identifying, using the processor, a plurality of equally sized data blocks of a second navigation file;
performing bytewise difference operations between the data blocks of the first navigation file to corresponding data blocks of the second navigation file;
storing a result of the bytewise difference operations in a plurality of navigation patch files; and
merging at least two of the plurality of navigation patch files into a merged navigation patch file.

Embodiment 2

The method of embodiment 1, wherein the corresponding data blocks of the second navigation file comprise:
a first subset of data blocks of the second navigation file in the same location as the corresponding data block from the first navigation file, wherein the first subset of data blocks of the second navigation file is the same length as the corresponding data block from the first navigation file;
a second subset of data blocks of the second navigation file in a location immediately preceding the location of the corresponding data block from the first navigation file, wherein the second subset of data blocks of the second navigation file is the same length as the corresponding data block from the first navigation file; and
a third subset of data blocks of the second navigation file in a location immediately following the location of the corresponding data block from the first navigation file, wherein the third subset of data blocks of the second navigation file is the same length as the corresponding data block from the first navigation file.

Embodiment 3

The method of embodiment 1, wherein a smallest navigation patch file for each data block of the second navigation file is merged into the merged navigation patch file.

Embodiment 4

The method of embodiment 1, wherein the identified data blocks of the first navigation file are larger than the identified data blocks of the second navigation file.

Embodiment 5

The method of embodiment 1, wherein the identifying a plurality of equally sized data blocks of the first navigation file includes identifying a remainder data block for the first navigation file that is smaller than the plurality of equally sized data blocks of the first navigation file, and identifying a plurality of equally sized data blocks of the second navigation file includes identifying a remainder data block for the second navigation file

Embodiment 6

The method of embodiment 1, further comprising:
identifying, using a processor, equally sized overlapping data blocks of the first navigation file;
performing bytewise difference operations of the overlapping data blocks of the first navigation file to corresponding data blocks of the second navigation file; and
storing the result of the bytewise difference operations with the plurality of navigation patch files, wherein the merging step merges one navigation patch file for each data block of the second navigation file.

Embodiment 7

The method of embodiment 6, wherein the corresponding data blocks of the second navigation file to the overlapping data blocks comprise:
a first subset of data blocks of the second navigation file in the same location as the corresponding overlapping data block from the first navigation file, wherein the first subset of data blocks of the second navigation file is the same length as the corresponding data block from the first navigation file;
a second subset of data blocks of the second navigation file in a location immediately preceding the location of the corresponding overlapping data block from the first navigation file, wherein the second subset of data blocks of the second navigation file is the same length as the a data block from the first navigation file; and
a third subset of data blocks of the second navigation file in a location immediately following the location of the corresponding overlapping data block from the first navigation file, wherein the second subset of data blocks of the second navigation file is the same length as a data block from the first navigation file.

Embodiment 8

The method of embodiment 6, wherein the smallest navigation patch file for each data block of the second navigation file is merged into the merged navigation patch file.

Embodiment 9

The method of embodiment 6, wherein the identified data blocks of the first navigation file are larger than the identified data blocks of the second navigation file and the identified overlapping data blocks of the first navigational file are two times larger than the identified data blocks of the second navigation file.

Embodiment 10

The method of embodiment 6, wherein the identifying a plurality of equally sized data blocks of the first navigation file includes identifying a remainder data block for the first navigation file that is smaller than the plurality of equally sized data blocks of the first navigation file, and identifying a plurality of equally sized data blocks of the second navigation file includes identifying a remainder data block for the second navigation file

Embodiment 11

An apparatus comprising:
at least one processor; and
at least one memory including computer program code for one or more programs;
the at least one memory and the computer program code configured to, with the at least one processor, cause the apparatus to at least perform:
dividing a first navigation file into a first plurality of data elements having a first predetermined size;
defining a second plurality of data elements of the first navigation file having a second predetermined size, wherein a midpoint of each of the second plurality of data elements of the first navigation file intersects a border between two of the first plurality of data elements of the first navigation file;
dividing a second navigation file into a plurality of data elements having a third predetermined size;
calculating a plurality of bytewise differences between each of the first plurality of data elements of the first navigation file to corresponding data elements of the plurality of data elements of the second navigation file and
between each of the second plurality of data elements of the first navigation file to corresponding data elements of the plurality of data elements of the second navigation file; and
storing the bytewise differences as a plurality of navigation patch files.

Embodiment 12

The apparatus of embodiment 11, wherein the at least one memory and the computer program code configured to, with the at least one processor, cause the apparatus to at least perform:
combining at least two of the plurality of the plurality of navigation patch files into a final navigation patch file.

Embodiment 13

The apparatus of embodiment 12, wherein the at least one memory and the computer program code configured to, with the at least one processor, cause the apparatus to at least perform:
transferring the final navigation patch file to a navigation system.

Embodiment 14

The apparatus of embodiment 12, wherein corresponding to the data elements of the second navigation file comprise:

a first subset of data elements of the second navigation file in the same location as the corresponding data element from the first navigation file, wherein the first subset of data elements of the second navigation file is the same size as the corresponding data element of the first navigation file;

a second subset of data elements of the second navigation file in a location immediately preceding the location of the corresponding data element of the first navigation file, wherein the second subset of data elements of the second navigation file is of the first predetermined size; and a third subset of data elements of the second navigation file in a location immediately following the location of the corresponding data block from the first navigation file, wherein the second subset of data elements of the second navigation file is of the first predetermined size.

Embodiment 15

The apparatus of embodiment 14, wherein the first predetermined size is larger than the third predetermined size.

Embodiment 16

The apparatus of embodiment 15, wherein the third predetermined size is half of the second predetermined size.

Embodiment 17

The apparatus of embodiment 15, wherein the smallest navigation patch file for each data block of the second navigation file is combined into the final navigation patch file Embodiment 18

A non-transitory computer readable medium including instructions that when executed are operable to:
  receive a first navigation file and a second navigation file, wherein the navigation files include road segment attributes;
  divide the first navigation file into equally sized data blocks, a remainder data block and overlapping data blocks;
  divide the second navigation file into equally sized data blocks and a remainder data block;
  perform bytewise subtraction difference operations between the between each data block of the first navigation file to related data blocks of the second navigation file and to data blocks of the second navigation file corresponding to a left focus and a right focus; and
  store the result of the bytewise subtraction difference operations in a plurality of navigation patch files.

Embodiment 19

The non-transitory computer readable medium of embodiment 18, wherein the non-transitory computer readable medium includes instructions to:
  merge at least two of the plurality of navigation patch files into a merged navigation patch file.

Embodiment 20

The non-transitory computer readable medium of embodiment 18, wherein the left focus and the right focus of the second navigation file are equal in size to the data blocks of the first navigation file.

The invention claimed is:

1. A method comprising:
  dividing a first navigation file into a first plurality of data elements having a first predetermined size;
  defining a second plurality of data elements of the first navigation file having a second predetermined size, wherein a midpoint of each of the second plurality of data elements of the first navigation file intersects a border between two of the first plurality of data elements of the first navigation file;
  dividing a second navigation file into a plurality of data elements having a third predetermined size, wherein the first predetermined size is greater than the third predetermined size by at least a predefined amount;
  calculating a plurality of binary differences between each of the first plurality of data elements of the first navigation file to corresponding data elements of the plurality of data elements of the second navigation file and between each of the second plurality of data elements of the first navigation file to corresponding data elements of the plurality of data elements of the second navigation file;
  storing the binary difference operations in a plurality of navigation patch files;
  merging at least two of the plurality of navigation patch files into a merged navigation patch file, the merged navigation patch file comprising a first page and one or more other pages; and
  compressing the one or more other pages to generate an updated merged navigation patch file that comprises the compressed one or more other pages and the first page, the first page being uncompressed, said first page comprising an alphanumeric identification value of a compression algorithm and a starting page of the compressed one or more other pages.

2. The method of claim 1, wherein the merged navigation patch file is applied to a decompressed region of a navigation database of a mobile device.

3. The method of claim 2, further comprising:
  inserting a compression algorithm value in the merged navigation patch file.

4. The method of claim 1, further comprising:
  dividing the merged navigation patch file into a first navigation patch file and a second navigation patch file; and
  sending the first navigation patch file to a mobile device, wherein the first navigation patch file is applied to a first decompressed region of a navigation database of the mobile device.

5. The method of claim 4, further comprising:
  receiving a request for an update from the mobile device, wherein the request includes data specifying a size for the first navigation patch file.

6. The method of claim 5, further comprising:
  sending the second navigation patch file to the mobile device, wherein the second navigation patch file is applied to a second decompressed region of a navigation database of the mobile device.

7. The method of claim 6, wherein the second navigation patch file is applied after the first navigation patch file.

8. The method of claim 6, wherein a size of a memory of the mobile device for the navigation database is less than a combined size of the first and second decompressed regions.

9. The method of claim 8, further comprising:
  identifying a remainder data block for the first navigation file that is smaller than the plurality of equally sized data blocks of the first navigation file.

10. The method of claim 9, wherein identifying a plurality of equally sized data blocks of the second navigation file includes identifying a remainder data block for the second navigation file that is smaller than the plurality of equally sized data blocks of the second navigation file.

11. An apparatus comprising:
at least one processor; and
at least one memory including computer program code for one or more programs; the at least one memory and the computer program code configured to, with the at least one processor, cause the apparatus to at least perform:
dividing a first navigation file into a first plurality of data elements having a first predetermined size;
defining a second plurality of data elements of the first navigation file having a second predetermined size, wherein a midpoint of each of the second plurality of data elements of the first navigation file intersects a border between two of the first plurality of data elements of the first navigation file;
dividing a second navigation file into a plurality of data elements having a third predetermined size, wherein the first predetermined size is greater than the third predetermined size by at least a predefined amount;
calculating a plurality of binary differences between each of the first plurality of data elements of the first navigation file to corresponding data elements of the plurality of data elements of the second navigation file and between each of the second plurality of data elements of the first navigation file to corresponding data elements of the plurality of data elements of the second navigation file;
storing the binary differences as a plurality of navigation patch files;
merging two or more of the plurality of navigation patch files to form a merged navigation patch file, the merged navigation patch file comprising a first page and one or more other pages; and
compressing the one or more other pages to generate an updated merged navigation patch file that comprises the compressed one or more other pages and the first page, the first page being uncompressed, said first page comprising an alphanumeric identification value of a compression algorithm and a starting page of the compressed one or more other pages.

12. The apparatus of claim 11, wherein at least one of the plurality of patch files is applied to a decompressed region of a navigation database of a mobile device.

13. The apparatus of claim 11, the at least one memory and the computer program code configured to, with the at least one processor, cause the apparatus to at least perform:
inserting a compression algorithm value in at least one of the plurality of patch files.

14. The apparatus of claim 11, the at least one memory and the computer program code configured to, with the at least one processor, cause the apparatus to at least perform:
identifying a first navigation patch file and a second navigation patch file from the plurality of patch files; and
sending the first navigation patch file to a mobile device, wherein the first navigation patch file is applied to a first decompressed region of a navigation database of the mobile device.

15. The apparatus of claim 11, the at least one memory and the computer program code configured to, with the at least one processor, cause the apparatus to at least perform:
sending the second navigation patch file to the mobile device, wherein the second navigation patch file is applied to a second decompressed region of a navigation database of the mobile device.

16. The apparatus of claim 15, wherein the second navigation patch file is applied after the first navigation patch file.

17. The method of claim 15, wherein a size of a memory of the mobile device for the navigation database is less than a combined size of the first and second decompressed regions.

18. A non-transitory computer readable medium including instructions that when executed are operable to:
divide a first navigation file into a first plurality of data elements having a first predetermined size;
define a second plurality of data elements of the first navigation file having a second predetermined size, wherein a midpoint of each of the second plurality of data elements of the first navigation file intersects a border between two of the first plurality of data elements of the first navigation file;
divide a second navigation file into a plurality of data elements having a third predetermined size, wherein the first predetermined size is greater than the third predetermined size by at least a predefined amount;
calculate a plurality of binary differences between each of the first plurality of data elements of the first navigation file to corresponding data elements of the plurality of data elements of the second navigation file and between each of the second plurality of data elements of the first navigation file to corresponding data elements of the plurality of data elements of the second navigation file;
store the binary differences in a plurality of navigation patch files;
merge two or more of the plurality of navigation patch files to form a merged navigation patch file, the merged navigation patch file comprising a first page and one or more other pages; and
compress the one or more other pages to generate an updated merged navigation patch file that comprises the compressed one or more other pages and the first page, the first page being uncompressed, said first page comprising an alphanumeric identification value of a compression algorithm and a starting page of the compressed one or more other pages.

19. The non-transitory computer readable medium of claim 18, the instructions further operable to:
identify a first navigation patch file and a second navigation patch file from the plurality of navigation patch files; and
send the first navigation patch file to a mobile device, wherein the first navigation patch file is applied to a first decompressed region of a navigation database of the mobile device.

20. The non-transitory computer readable medium of claim 19, the instructions further operable to:
send the second navigation patch file to the mobile device, wherein the second navigation patch file is applied to a second decompressed region of a navigation database of the mobile device.

21. The non-transitory computer readable medium of claim 20, wherein the second navigation patch file is applied after the first navigation patch file.

22. The method of claim 1, wherein each of the plurality of equally sized data blocks of the first navigation file are at least eight times larger than each of the plurality of equally sized data blocks of the second navigation file.

* * * * *

UNITED STATES PATENT AND TRADEMARK OFFICE
CERTIFICATE OF CORRECTION

PATENT NO. : 11,334,605 B2
APPLICATION NO. : 15/579073
DATED : May 17, 2022
INVENTOR(S) : Martin Pfeifle et al.

Page 1 of 1

It is certified that error appears in the above-identified patent and that said Letters Patent is hereby corrected as shown below:

On the Title Page

In Column 1, item (30), under "Foreign Application Priority Data", insert -- Jun. 04, 2015 (IN) ............... 2800/CHE/2015 --.

In the Claims

In Column 26, Line 6, Claim 17, delete "method" and insert -- apparatus --, therefor.

Signed and Sealed this
Twenty-fifth Day of July, 2023

Katherine Kelly Vidal
*Director of the United States Patent and Trademark Office*